United States Patent [19]

Adlhoch

[11] 4,415,992
[45] Nov. 15, 1983

[54] MEMORY SYSTEM HAVING MEMORY CELLS CAPABLE OF STORING MORE THAN TWO STATES

[75] Inventor: Richard H. Adlhoch, Tempe, Ariz.

[73] Assignee: Motorola, Inc., Schaumburg, Ill.

[21] Appl. No.: 238,177

[22] Filed: Feb. 25, 1981

[51] Int. Cl.³ .............................................. G11C 11/40
[52] U.S. Cl. ...................................... 365/94; 365/207; 365/210
[58] Field of Search ................... 365/94, 95, 103, 104, 365/149, 174, 210, 200, 182, 207

[56] References Cited

U.S. PATENT DOCUMENTS

| | | |
|---|---|---|
| 4,094,008 | 6/1978 | Lockwood et al. ................. 365/149 |
| 4,202,044 | 5/1980 | Beilstein, Jr. et al. ............... 365/182 |
| 4,342,102 | 7/1982 | Puar ....................................... 365/207 |

*Primary Examiner*—Joseph A. Popek
*Attorney, Agent, or Firm*—Joe E. Barbee

[57] ABSTRACT

A memory system having a plurality of memory cells each capable of storing more than two states also has a reference voltage generator which is used to determine the state stored in a selected memory cell. The plurality of memory cells are arranged in groups of columns, and in a preferred embodiment, the reference voltage generator is arranged in columns which are located between two of the groups of columns. The memory system uses voltage sensing as opposed to current sensing and therefore the only current used is to charge line capacitances. The voltage reference generator is only enabled during the period of time that a cell is being read from.

11 Claims, 3 Drawing Figures

4,415,992

MEMORY SYSTEM HAVING MEMORY CELLS CAPABLE OF STORING MORE THAN TWO STATES

CROSS REFERENCE TO RELATED APPLICATIONS

Patent application Ser. Nos. 238,183 and 238,178 are related co-pending applications by the same inventor, assigned to the same assignee, and filed on same date as the present invention.

BACKGROUND OF THE INVENTION

This invention relates, in general, to memory systems, and more particularly, to a memory system having a plurality of memory cells each capable of storing more than two states.

Solid state memories are well-known, and particularly solid state memories using metal oxide semiconductor field effect transistors. There is a continuous effort to make memory systems smaller, faster, and use less power. One way to make a memory smaller is to be able to store more information in each memory cell location. However, one of the problems with such a memory is the ability to distinguish which state is stored in a selected memory cell. Some reference source will be required, but in order to make the memory a competitive product it must remain relatively small in overall size and low in power consumption.

The present invention provides such a memory system. Each memory cell is capable of storing more than two states. The memory cells are arranged in a manner that permits them to be made relatively small in size, which results in fast operation and low power consumption. The invention is described as having memory cells capable of storing four states which provides two binary bits. It will be understood that a memory cell could be built employing the principles of the present invention having memory cells capable of storing more than four different states. The present invention also has a reference voltage generator which consumes a very minimum amount of power and is only energized when data is being read from the memory. The reference voltage generator is built in a manner to conserve silicon chip area and to maximize speed of operation of the memory.

SUMMARY OF THE INVENTION

In carrying out the above and other objects and advantages of the present invention, there is provided a memory system having a plurality of memory cells capable of storing more than two states. In order to read data out of the system and determine the stored state, a reference voltage generator is provided which generates an output only when the memory is being read from. The memory system also includes a unique sense amplifier and translator which translates the output of the sense amplifier into binary format. The voltage reference generator is arrranged in columns which are spaced among the memory cell columns in a manner which minimizes reading time.

The exemplification set out herein illustrates the preferred embodiment of the invention in one form thereof, and such exemplification is not to be construed as limiting in any manner.

DETAILED DESCRIPTION OF THE DRAWINGS

Figure 1:
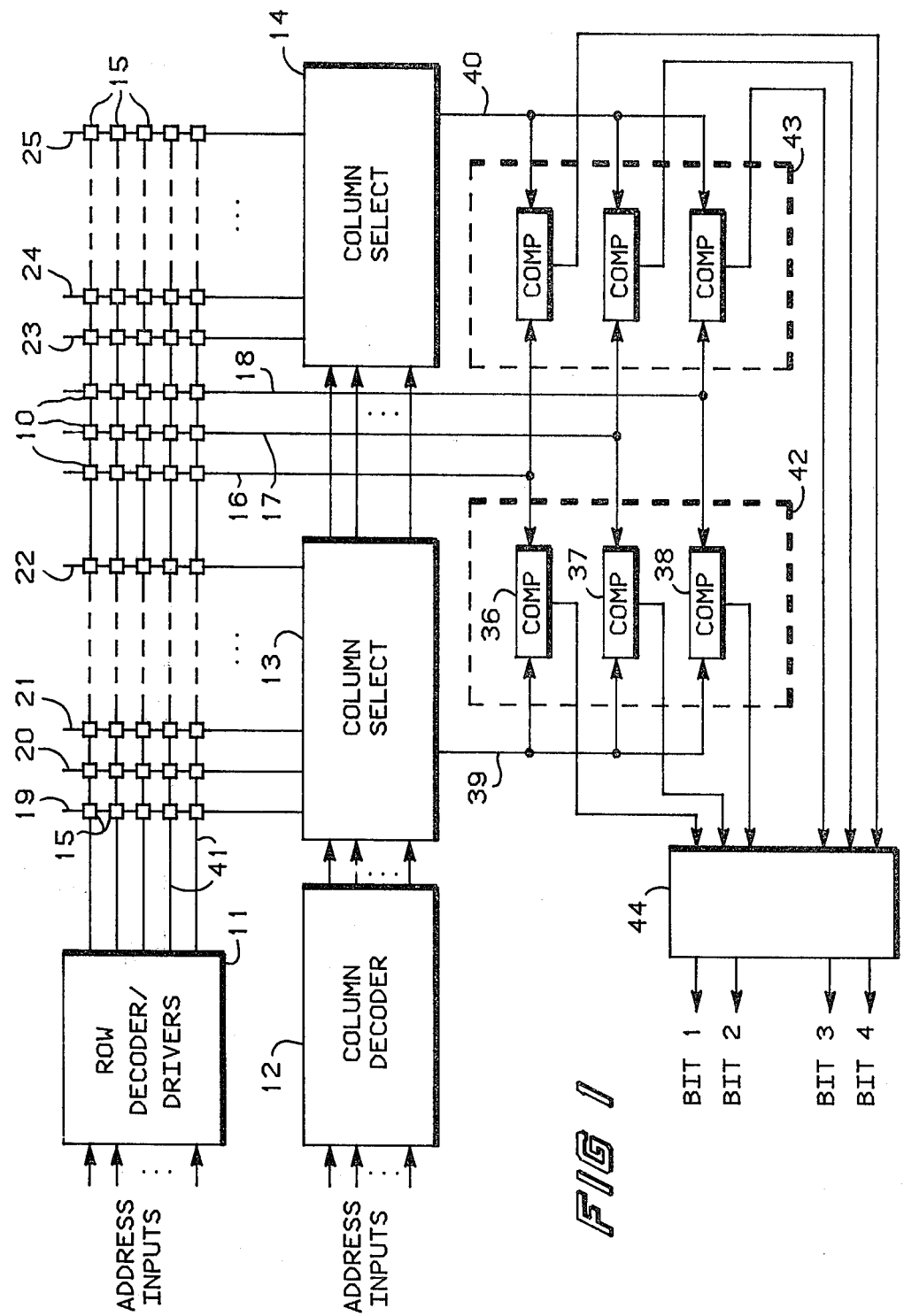
FIG. 1 represents a memory system in block diagram form in accordance with an embodiment of the present invention.

A portion of a memory array along with the peripheral circuitry required to provide a memory system is illustrated in FIG. 1. The memory system shown in FIG. 1 is capable of being integrated onto a single semiconductor chip. The memory system has a row decoder 11 which receives row address inputs and provides an output which drives a selected row 41. The row address inputs are decoded by row decoder 11 so that only the selected row 41 is enabled. Although only five row select lines 41 are illustrated, it will be understood that in an actual memory there are usually many more row select lines. Row decoder 11 will typically include drivers to drive the decoder output since the decode will have many transistors connected to its output. A column decoder 12 receives column address inputs and provides outputs for enabling the selected column select devices in column select 13 and 14. Two groups of columns are illustrated. The first group of columns is represented by columns 19, 20, 21 and 22. The dashed lines between columns 21 and 22 indicate that in an actual system many more columns than just the four illustrated would be controlled by column select 13. The second group of columns is illustrated by columns 23, 24 and 25. The dashed lines between columns 24 and 25 indicate that in an actual system many more columns would be controlled by column select 14. In a preferred embodiment, column select 13 will control the same number of columns that column select 14 controls. Located between the two groups of columns are reference columns 16, 17 and 18.

The memory system illustrated in FIG. 1 will have a plurality of memory cells 15, wherein each memory cell is capable of storing more than two states. The memory cells are more fully described in related patent application Ser. No. 238,183 which is hereby incorporated herein by reference. Voltage reference columns 16, 17 and 18 each provide a different voltage level. Since it will not be known ahead of time which state is stored in one of memory cells 15, each time a memory cell is selected the three references must be used to determine which state is stored. Each reference cell 10 will contain a single transistor which will be substantially the same size as the single transistor contained within each memory cell 15. The voltage reference generator is described more fully in related patent application Ser. No. 238,178 which is hereby incorporated herein by reference.

Reference columns 16, 17 and 18 are each directly connected to sensing circuits 42 and 43. Sensing circuit 42 has three comparators 36, 37 and 38. Sensing circuit 43 also has three comparators which are identical to each of the comparators in sensing circuit 42. Column select 13 provides an output on line 39 which is connected to each of the comparators 36, 37 and 38. Column select 14 provides an output on line 40 which is connected to each of the comparators within sensing circuit 43. Each comparator in sensing circuit 42 and 43 provides an output which is connected to a transistor or decoder 44. The operation of the sensing circuits and translator 44 will be described in greater detail hereinafter.

Translator 44 is illustrated as providing a four binary bit output. The memory system illustrated in FIG. 1, by way of example, provides a four bit output. However, it will be understood that most memories provide an eight bit output since most words contain eight bits. Those persons skilled in the art will recognize that it will be necessary to provide two more groups of columns controlled by two more column selects and each group having a sensing circuit for an eight bit output.

In a preferred embodiment, the reference columns are arranged so that approximately the same time delay will be experienced from the furthermost memory column in one group as the furthermost memory column in the next group. For example, the delay from reference column 17 to column 19 will be the same as the delay from reference column 17 to column 25 assuming that column 19 is the furthermost column away on the left hand side and column 25 is the furthermost column away on the right hand side of reference column 17. In a memory system wherein time delays are not critical then only one group of reference columns is necessary and the single group of reference columns can service as many sensing circuits as required. A memory system providing a two binary bit output would only require one sensing circuit. In such a memory system the data contained in each memory cell location could be read out individually.

All reference cells 10 in column 16 provide the same voltage, while all the reference cells in column 17 will provide the same voltage which will be different from the voltage provided by the reference cells of column 16. All the reference cells of column 18 provide the same voltage which is also different from the voltage provided by the reference cells of column 16 or 17. When a row is selected, each of columns 16, 17, and 18 will provide a reference voltage so that each time a cell or cells are read from all three of the reference voltages required will be generated. Since it was assumed that only four states are stored in any one cell, only three references are required to determine which state is stored. One of the states is assumed to represent logic signal 00 or 11 and therefore does not require a reference. The state not requiring a reference can either be represented by the highest voltage or the lowest voltage available from a memory cell.

Figure 2:
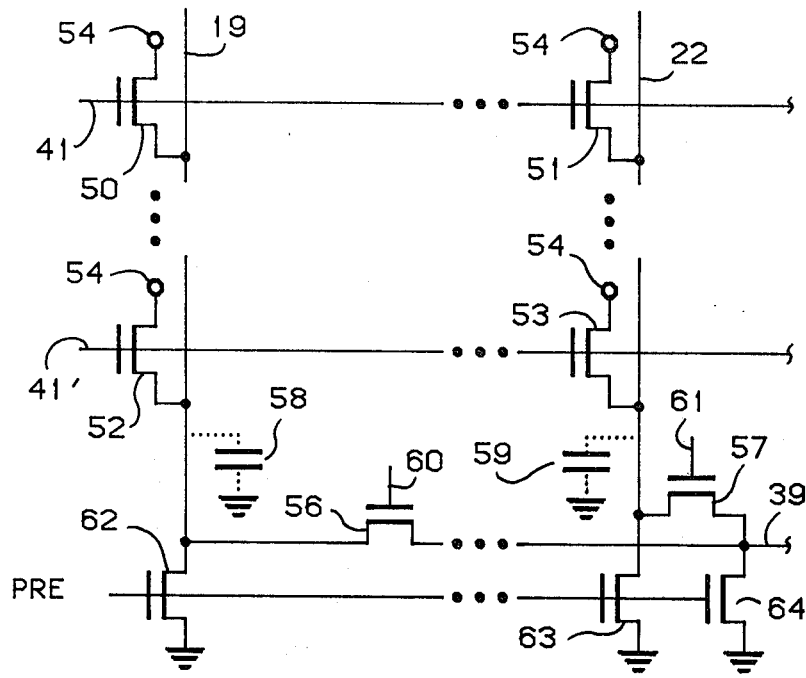
FIG. 2 schematically shows a portion of the memory system of FIG. 1.

FIG. 2 illustrates, in schematic form, portions of columns 19 and 22 of FIG. 1. Transistor 50 represents a memory storage location as do transistors 51, 52 and 53. Each of the transistors is connected in a source follower configuration having their drains connected to voltage terminal 54 and their sources connected to a column line. Transistors 50 and 52 have their sources connected to column 19 whereas transistors 51 and 53 have their sources connected to column 22. Row select line 41 is connected to the gate electrodes of transistors 50 and 51, and row select line 41' is connected to the gate electrodes of transistors 52 and 53. In the system illustrated in FIG. 1 each row line is connected to the gate electrodes of one transistor in each column that is intersected by the row select line including the voltage reference generators. Each column line has an associated parasitic capacitance. The parasitic capacitance for column 19 is illustrated by capacitor 58, and the parasitic capacitance for column 22 is illustrated by capacitor 59. Each column as well as output line 39 is connected to a voltage reference during a precharge phase. Transistor 62 connects column 19 to the voltage reference, illustrated as ground, when a precharge signal connected to its gate electrode enables transistor 62. Column 22 is coupled to ground by transistor 63 and transistor 64 couples line 39 to ground. Transistors 63 and 64 are also enabled by the precharge signal. Transistors 56 and 57 serve as column select devices. Transistor 56 couples column 19 to line 39, and transistor 57 couples column 22 to line 39. The gate electrode of transistor 56 is connected to line 60, and the gate electrode of transistor 57 is connected to line 61. Lines 60 and 61 represent output lines for column decoder 12 (shown in FIG. 1). Column select 13 and column select 14 each contain a plurality of transistors such as transistors 56 and 57. Each transistor connects one column to line 39 or line 40.

Each reference column 16, 17, and 18 will look like column 19 and 22 except that the reference columns will not have column select devices such as transistors 56 and 57. Another difference, which is not a visual difference, is that all the transistors in a given reference column 16, 17 or 18 will each have the same threshold voltage. The transistors in a memory column, such as columns 19 and 22, will most likely not all have the same threshold voltage. The threshold voltage will be adjusted to represent the state stored at a given location.

Figure 3:
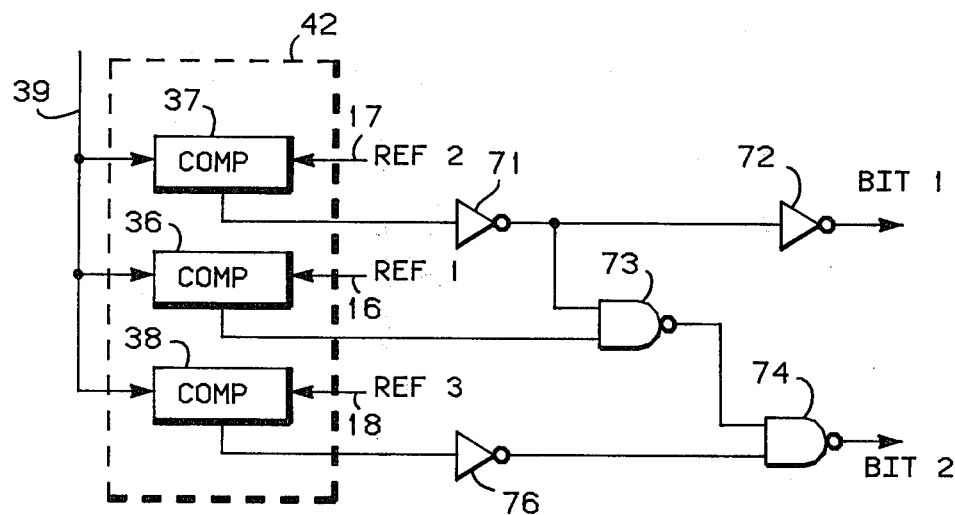
FIG. 3 illustrates in logic and block diagram form a portion of the memory system of FIG. 1.

FIG. 3 shows sensing circuit 42 along with a portion of translator 44. Sensing circuit 42 has comparators 36, 37 and 38 which receive an input from line 39. Comparator 36 also receives a first reference input on column line 16, comparator 37 receives a second reference input on column line 17 and comparator 38 receives a third reference input on column line 18. The output of comparator 37 goes to an inverter 71. Inverter 71 provides an output which goes to an input of NAND gate 73 and to the input of inverter 72. The output of inverter 72 represents a binary digit shown as Bit 1. The output of comparator 36 goes to a second input of NAND gate 73. The output of NAND gate 73 goes to an input of NAND gate 74. The output of comparator 38 goes to an input of inverter 76. The output of inverter 76 goes to a second input of NAND gate 74. The output of NAND gate 74 is a binary digit shown as Bit 2. Inverters 71, 72, and 76 along with NAND gates 73 and 74 are part of translator 44 (FIG. 1).

The truth table for the circuitry illustrated in FIG. 3 is as follows:

| Memory Cell Output | Comparator Output | | | Bit | Bit |
|---|---|---|---|---|---|
| (Unknown) | C1 | C2 | C3 | 1 | 2 |
| 1 (highest) | 0 | 0 | 0 | 0 | 0 |
| 2 | 1 | 0 | 0 | 0 | 1 |
| 3 | 1 | 1 | 0 | 1 | 0 |
| 4 (lowest) | 1 | 1 | 1 | 1 | 1 |

The left hand column of the truth table indicates the four states that can be stored in the memory cells. Since the transistor in each memory cell is connected in a source follower configuration the output from the memory cells will be a voltage. Number 1, in the left hand column, is assumed to be the highest voltage with number 4 the lowest voltage. Comparator output C1 is the output for comparator 36, comparator output C2 is the output for comparator 37, and comparator output C3 is the output for comparator 38. Through an arbitrary choice, when the highest output voltage from a memory cell is present, all the comparator outputs are zeros which represent output bits 1 and 2 as zeros. When the second highest voltage level is present in the selected memory cell then the output from comparator 36 is a logic level "1" while the output from comparators 37 and 38 are logic levels "0" which produce output Bit 1 as a logic level "0" and output Bit 2 as a logic level "1". When the third highest voltage level is present in a selected memory cell then the output of comparators 36 and 37 are logic level "1's" and the output of comparator 38 is a logic level "0" making output Bit 1 a logic level "1" and output Bit 2 a logic level "0". The lowest voltage level in a memory cell causes all the outputs from the comparators to be logic level "1's" making output Bit 1 a logic level "1" and output Bit 2 a logic level "1". From this it can be seen that the first reference voltage level provided by column line 16 can be equal to the second highest voltage level or could be some value between the first and second highest voltage levels. The second reference voltage level provided by column line 17 could be equal to the third highest voltage level or some voltage level between voltage levels 2 and 3. The third reference voltage level provided by column line 18 could be equal to the lowest voltage level or some value between the third and fourth voltage levels.

By now it should be appreciated that there has been provided a unique memory system having a plurality of memory cells which are capable of storing more than two states. The memory system includes a plurality of references which are used to determine a state stored in a selected memory cell. The memory system is arranged in such a manner to result in a small memory which consumes a minimum amount of power and operates with minimum time delay. Each of the reference voltages is generated by a transistor having a threshold voltage close to or the same as a threshold voltage of a transistor used in the memory array and connected in the same manner. Thus each of the reference voltages will correspond very closely to one of the four possible voltages out of the memory cell. The required voltage levels are not generated until a row is selected. The reference voltage devices are arranged in columns which are in a layout similar to the memory columns. Consequently, any circuit parameter which can affect performance and which might vary in processing will vary the reference devices exactly the same as the memory devices. Therefore, the reference voltages will track the memory signals and the memory array will work over a wide range of processing parameters. The memory system has been illustrated as a read only memory and utilizes voltage sensing rather than current sensing. Thus, the only current needed is that required to charge the line capacitance. In addition, the memory devices can all be made minimum size, and hence the memory system can be made to draw very little power.

I claim:

1. A read only memory having a plurality of rows and columns, comprising: a plurality of memory cells arranged into the rows and columns, the memory cells being capable of storing more than two states; row decoder for receiving row addresses and providing a plurality of outputs, each of the outputs being coupled to a row so that when a predetermined row is addressed the predetermined row is activated; column select means coupled to each of the columns; column decoder for receiving column addresses and providing outputs to the column select means so that when a predetermined column is selected the predetermined column is coupled to an output of the column select means; a plurality of reference sources arranged in columns and rows so that a row of reference sources is enabled each time one of the plurality of rows of memory cells is enabled, the columns of reference sources being positioned in between columns of the memory cells; comparator means having a first input coupled to the output of the column select means and a second input coupled to the reference sources, the comparator means providing an output indicative of the state stored in a selected memory; and means for translating the state into a binary output.

2. The read only memory of claim 1, wherein the plurality of reference sources is one less than the number of states which each memmory cell is capable of storing.

3. The read only memory of claim 2 wherein the comparator means includes a separate comparator for each one of the plurality of reference sources.

4. The read only memory of claim 1 wherein each memory cell includes a field effect transistor connected in a source follower configuration.

5. The read only memory of claim 1 wherein the column select means includes a field effect transistor for each column.

6. The memory array of claim 1 wherein the columns having the plurality of reference sources are adjacent each other and have an equal number of memory cell columns on either side.

7. A memory array comprising a plurality of memory cells arranged in columns and rows, each memory cell being capable of storing more than two states; a plurality of references located among the memory cells and arranged in rows and columns like the memory cells; row decoder means for receiving row addresses and providing a row select signal for selecting an addressed row, the row select signal also enabling at least one reference; column select means for selecting a predetermined column; means coupled to the column select means for receiving an output from the column select means and for comparing the output against the at least one reference, the at least one reference being coupled to the means coupled to the column select means; and a translator for translating an output from the means coupled to the column select means to a digital output.

8. The memory array of claim 7 wherein the plurality of references are arranged so that all the references in a given column are the same.

9. The memory array of claim 7 wherein the columns having the plurality of references are located so as to have an equal number of memory cell columns on either side.

10. A memory array having a plurality of rows and columns of memory cells wherein the columns are divided up into groups having an equal number of columns, the memory cells each being capable of storing more than two states; a plurality of columns of reference cells located between adjacent groups of columns of memory cells, the reference cells being substantially identical in physical size to the memory cells; comparator means for receiving memory cell data comparing such data to one of the reference cells; and a translator for translating an output from the comparator means to binary data.

11. The memory array of claim 10 wherein the memory cells each being capable of storing more than two states can actually store at least four states; and the plurality of columns of reference cells being at least three columns, each column further comprising a plurality of reference cells wherein each reference cell has a field effect transistor wherein each of the columns of reference cells has transistors of different threshold voltages than the other of the columns of reference cells.

* * * * *